United States Patent
Imbornone et al.

(10) Patent No.: US 6,529,719 B1
(45) Date of Patent: Mar. 4, 2003

(54) IMAGE REJECT MIXER

(75) Inventors: James F. Imbornone, Methuen, MA (US); Jean-Marc Mourant, Groton, MA (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 09/608,765

(22) Filed: Jun. 30, 2000

(51) Int. Cl.[7] .................................................. H04B 1/30
(52) U.S. Cl. ........................ 455/302; 455/302; 455/303; 455/323
(58) Field of Search .................................. 455/302–323, 455/333, 285, 245.2; 330/252–261, 295, 133; 375/316–352, 261–285; 329/318–325, 304, 346; 327/355–359, 307; 348/725–726

(56) References Cited

U.S. PATENT DOCUMENTS 5,828,955 A * 10/1998 Lipowski et al. ........... 329/306
5,901,349 A * 5/1999 Guegnaud et al. .......... 455/285
5,903,827 A * 5/1999 Kennan et al. ............. 333/120
2002/0055347 A1 * 5/2002 Spargo et al. .............. 455/302

* cited by examiner

*Primary Examiner*—Thanh Cong Le
*Assistant Examiner*—Stephen M. D'Agosta
(74) *Attorney, Agent, or Firm*—Joseph P. Abate, Esq.; RatnerPrestia

(57) ABSTRACT

To overcome problems in an image reject mixer in a radio frequency receiver when there is a degradation in image rejection due to process variations, such as variations in the values of components, a reactance feedback path of a first differential amplifier in the intermediate frequency combiner of the image reject mixer is tuned during assembly of the radio frequency receiver. This tuning places the first differential amplifier and a second differential amplifier in the intermediate frequency combiner in phase quadrature when the pole frequency of reactance feedback path is at least ten times lower than the frequency of the intermediate frequency and sets the gain of the two differential amplifiers to be equal when the reactance of the reactance feed back path in the first differential amplifier is equal to the resistance of a resistance feedback path in second differential amplifier.

10 Claims, 3 Drawing Sheets

IMAGE REJECT MIXER

TECHNICAL FIELD

The present invention relates, in general, to the rejection of the image signal of a radio frequency signal converted to an intermediate frequency and, in particular, to the tuning or calibration of a frequency conversion mixer especially suited to be implemented on an integrated circuit.

BACKGROUND OF THE INVENTION

Unlike wireline communications, the wireless environment accommodates essentially an unlimited number of users sharing different parts of the frequency spectrum and very strong signals coexist next to very weak signals. A radio receiver must be able to select the signal of interest, while rejecting all others.

Among the important problems faced by the designers of radio receivers are image rejection and monolithic integration. A radio frequency receiver must be able to select the desired signal from its image. Otherwise, the subsequent detector circuit will be unable to distinguish between the desired signal and the image signal and, therefore, the output will be the result of the superposition of both. As wireless communications units evolve, means to reduce cost, size, and weight through monolithic integration are critical.

Image rejection relates to the ability of the radio frequency receiver to select the desired signal from the image of the desired signal spaced away by twice the intermediate frequency signal. This is important as the subsequent detector circuit will be unable to distinguish between the desired and image signals and, therefore, the output of the detector circuit will be a result of the superposition of both. This is the essence of the image signal problem.

In modern radio frequency receivers for wireless applications, when the problem of canceling unwanted image frequency response is handled in the mixer, typically 50 dB of image filtering is required from the overall system. This image filtering comes from a combination of pre-select band pass filtering, image filtering and possible use of an image reject filter. The high image rejection requirement means that the contribution of each circuit to the overall image rejection is critical.

FIG. 1 shows a conventional image reject mixer. An input radio frequency ($RF_{in}$) is supplied to two mixers 10 and 12. A first local oscillator signal ($LO_1$) also is supplied to mixer 10 and a second local oscillator signal ($LO_2$), in phase quadrature with the first local oscillator signal, is supplied to mixer 12. Mixer 10, responsive to the radio frequency input signal the first local oscillator signal, develops a first intermediate frequency signal and mixer 12, responsive to the radio frequency input signal the second local oscillator signal, develops a second intermediate frequency signal. The intermediate frequency signals pass through low pass filters 14 and 16 and the first intermediate frequency signal is shifted in phase by 90° by a phase shifter 18. The phase shifted first intermediate frequency signal and the second intermediate frequency signal are combined in an intermediate frequency combiner 20 which develops the output intermediate frequency output signal ($IF_{out}$).

FIG. 2 shows a conventional intermediate frequency combiner that can be used in the FIG. 1 image reject mixer. This intermediate frequency combiner has two differential amplifiers 22 and 24. For the intermediate frequency combiner to function properly, differential amplifiers 22 and 24 should be in phase quadrature and should have equal gain. Differential amplifiers 22 and 24 are in phase quadrature when the pole frequency of feedback capacitor 26 in differential amplifier 22 is ten times lower than the intermediate frequency and the differential amplifiers have equal gain when the magnitude of the capacitance reactance in differential amplifier 22 is equal to the resistance of feedback resistor 28 in differential amplifier 24.

Problems arise when there is degradation in image rejection in an image reject mixer due to process variations (i.e., variations in the values of components, such as feedback resistor 28 in differential amplifier 24 or feedback capacitor 26 in differential amplifier 24 in the intermediate frequency combiner).

SUMMARY OF THE INVENTION

To overcome the shortcomings of the prior ways of achieving image signal rejection considered above, a new image reject mixer is provided by the present invention. One object of the present invention is to provide a new and improved image reject mixer. Another object of the present invention is to provide a new and improved radio frequency receiver. A further object of the present invention is to provide a new and improved image reject mixer that is particularly suited for implementation in an integrated circuit.

Accordingly, an image reject mixer, constructed in accordance with the present invention, includes means for supplying a radio frequency input signal and means for supplying a first local oscillator signal and a second local oscillator signal in phase quadrature with the first local oscillator signal. Also included in this image reject mixer are a first mixer responsive to the radio frequency input signal and the first local oscillator signal for developing a first intermediate frequency signal and a second mixer responsive to the radio frequency input signal and the second local oscillator signal for developing a second intermediate frequency signal. An image reject mixer, constructed in accordance with the present invention, further includes means for phase shifting the first intermediate frequency signal by 90° and an intermediate frequency combiner for developing an intermediate frequency output signal. The intermediate frequency combiner has a first differential amplifier responsive to one of the second intermediate frequency signal and the 90° phase shifted first intermediate frequency signal and having a tunable reactance feedback path and a second differential amplifier responsive to the other of the second intermediate frequency signal and the 90° phase shifted first intermediate frequency signal and having a resistance feedback path. Also included in this image reject mixer are means for tuning the reactance feedback path of the first differential amplifier to place the first differential amplifier and the second differential amplifier in phase quadrature when the pole frequency of the reactance feedback path is at least ten times lower than the frequency of the intermediate frequency and to set the gain of the first differential amplifier equal to the gain of the second differential amplifier when the reactance of the reactance feed back path in the first differential amplifier is equal to the resistance of the resistance feedback path in the second differential amplifier.

It is to be understood that the foregoing general description of the invention and the following detailed description of the invention are exemplary, but are not restrictive of the invention.

DESCRIPTION OF THE DRAWINGS

The present invention is best understood from the following detailed description when read in conjunction with the accompanying drawings. Included in the drawings are the following figures.

DETAILED DESCRIPTION OF THE INVENTION

Figure 2:
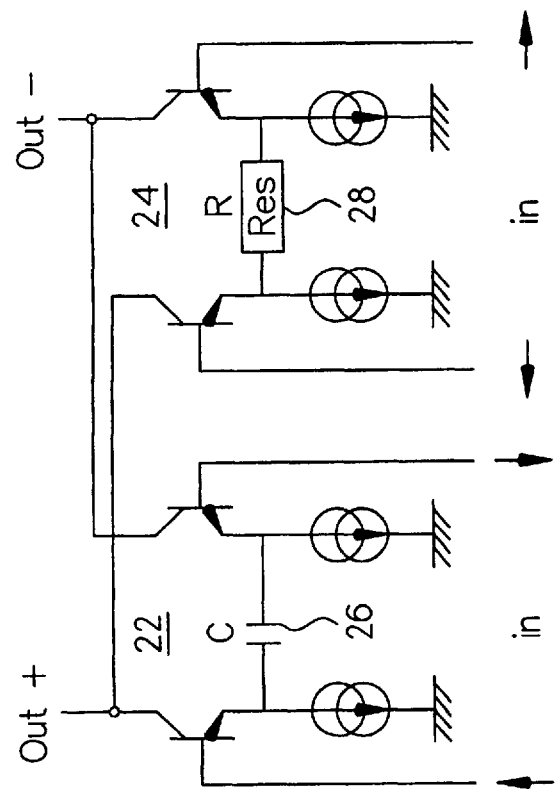
FIG. 2 is a diagram of a conventional intermediate frequency combiner that can be used in the FIG. 1 image reject mixer.
Figure 1:
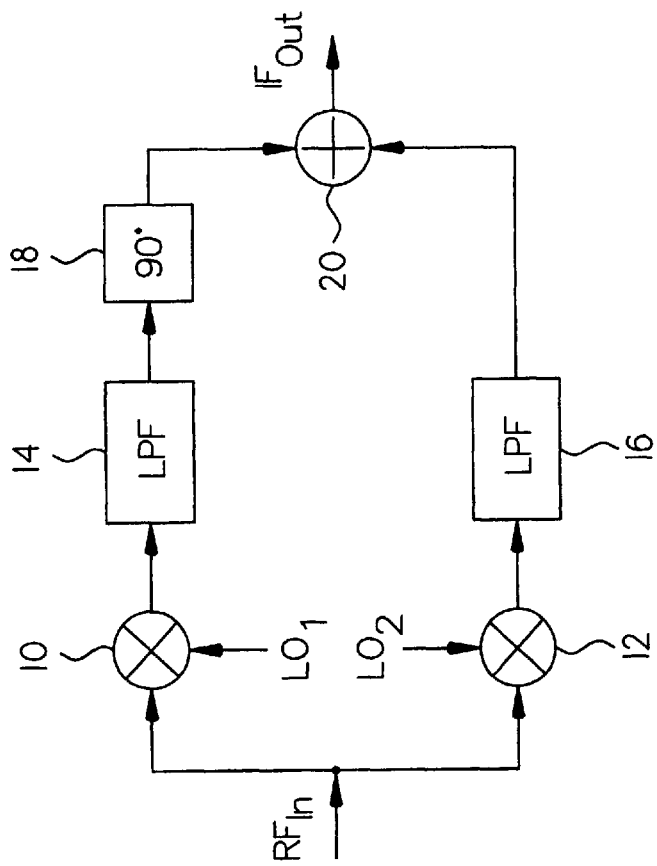
FIG. 1 is a diagram of a conventional image reject mixer.
Figure 3:
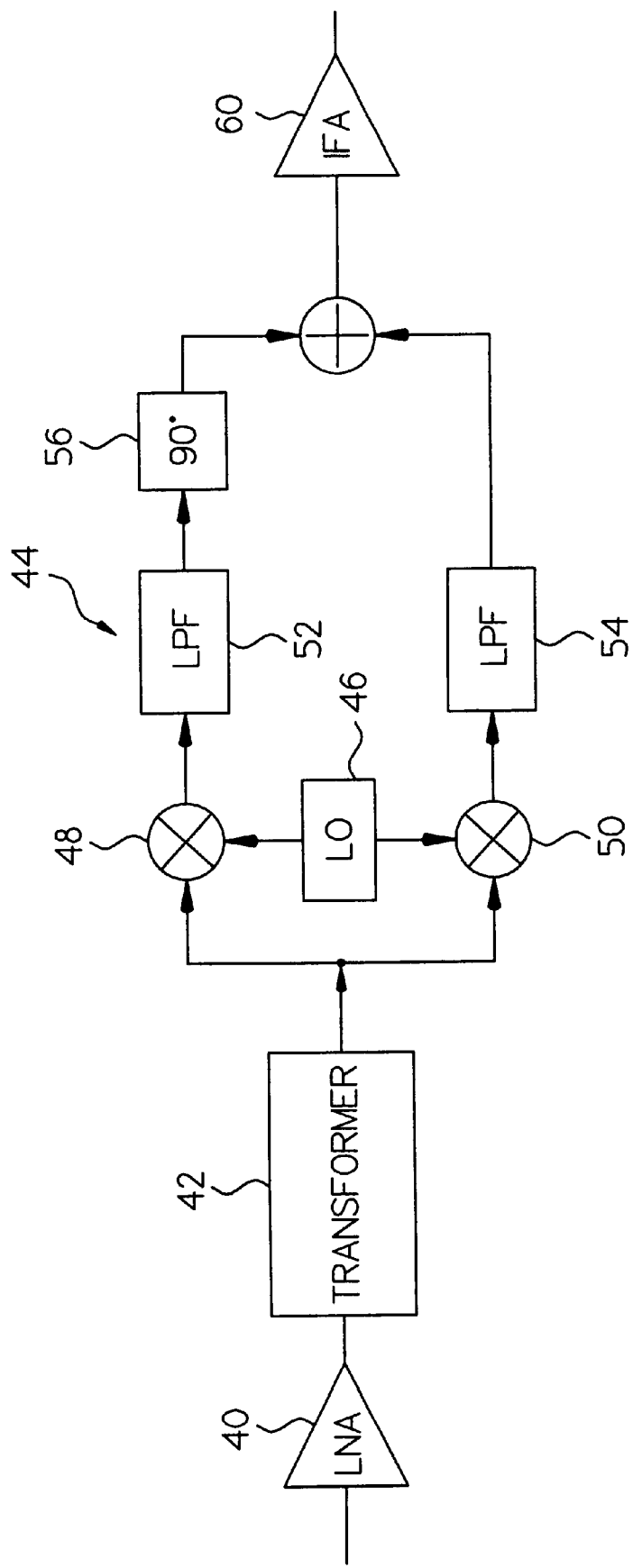
FIG. 3 is a block diagram of a radio frequency receiver in which an image reject mixer, constructed in accordance with the present invention, is used.

Referring to FIG. 3, which is a diagram of a radio frequency receiver having an image reject mixer constructed in accordance with the present invention, this radio frequency receiver includes an element for receiving a radio frequency signal. The element can include a low-noise amplifier 40 of conventional construction and operation, a center-tapped grounded secondary transformer of conventional construction and operation represented by block 42, and an antenna of conventional construction and operation (not shown) by which a received radio frequency signal is conducted to the circuitry of the receiver.

The radio frequency receiver of FIG. 3 also includes an image reject mixer 44, constructed in accordance with the present invention, for developing an intermediate frequency signal from the radio frequency signal. Image reject mixer 44 includes a local oscillator 46 of coventional construction and operation and first and second mixers 48 and 50 of conventional construction and operation. Local oscillator 46 supplies a first local oscillator signal to mixer 48 and a second local oscillator signal, in phase quadrature, with the first local oscillator signal to mixer 50. Mixer 48, responsive to the first local oscillator signal and the output of transformer 42, develops a first intermediate frequency signal and mixer 50, responsive to the second local oscillator signal and the output of transformer 42, develops a second intermediate frequency signal. The first and second intermediate frequency signals pass through low pass filters 52 and 54, respectively, of conventional construction and operation. The first intermediate frequency signal is phase shifted 90° by a phase shifter 56 of conventional construction and operation. The phase shifted first intermediate frequency signal and the second intermediate frequency signal are combined in an intermediate frequency combiner 58, such as the one illustrated by FIG. 4.

A radio frequency receiver, constructed in accordance with the present invention, further includes an intermediate frequency amplifier 60 of conventional construction and operation.

Figure 4:
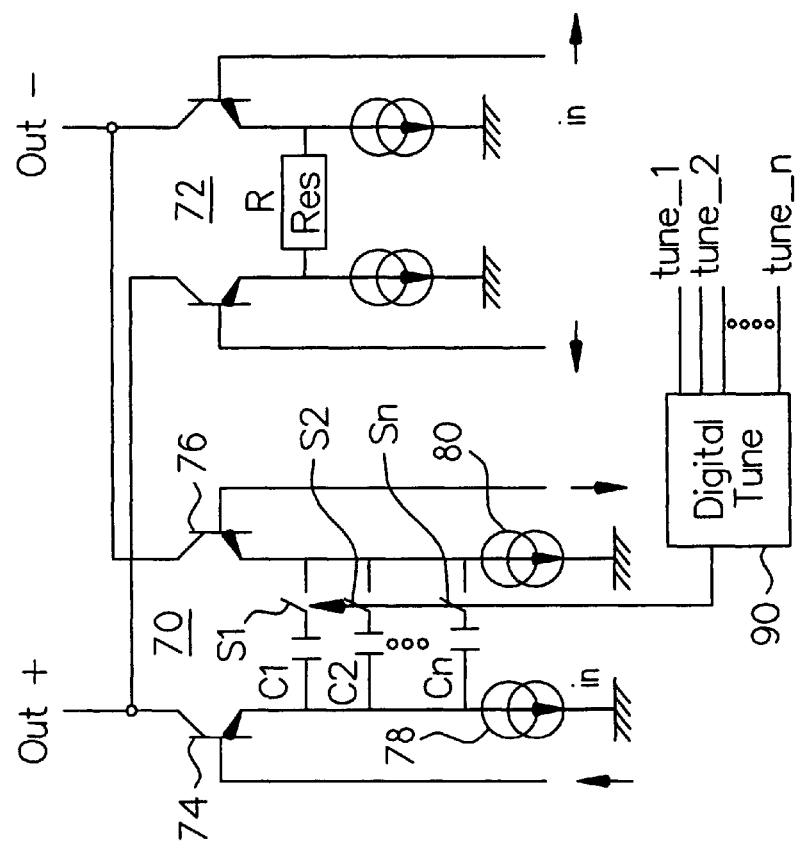
FIG. 4 is a diagram of a preferred embodiment of an intermediate frequency combiner constructed in accordance with the present invention in which the tuning function is implemented with ideal switches.

Referring to FIG. 4, which illustrates a preferred embodiment of an intermediate frequency combiner constructed in accordance with the present invention, this combiner includes a first differential amplifier 70 responsive to one of the second intermediate frequency signal and the 90° phase shifted first intermediate frequency signal. Differential amplifier 70 has a tunable reactance feedback path in the form of a plurality of capacitor C1, C2 . . . Cn, and a plurality of switches S1, S2 . . . Sn individually in series with the capacitors.

The FIG. 4 intermediate frequency combiner also includes a second differential amplifier 72 responsive to the other of the second intermediate frequency signal and the 90° phase shifted first intermediate frequency signal. Differential amplifier 72 has a resistance feedback path R.

Differential amplifier 70 also includes transistors 74 and 76 and constant current sources 78 and 80 individually connected in series with transistors 74 and 76, respectively. Differential amplifier 72 also includes transistors 82 and 84 and constant current sources 86 and 88 individually connected in series with transistors 82 and 84, respectively.

The FIG. 4 intermediate frequency combiner develops an intermediate frequency output signal from the second intermediate frequency signal and the 90° phase shifted first intermediate frequency signal.

As indicated above, for the intermediate frequency combiner to function properly, differential amplifiers 70 and 72 should be in phase quadrature and should have equal gain. Differential amplifiers 70 and 72 are in phase quadrature when the pole frequency of the reactance feedback path in differential amplifier 70 is ten times lower than the intermediate frequency and differential amplifiers 70 and 72 have equal gain when the magnitude of the reactance of the reactance feedback path in differential amplifier 70 is equal to the resistance of the resistance feedback path in differential amplifier 72.

To overcome problems when a degradation in image rejection due to process variations (i.e., variations in the values of components, such as in the feedback paths of the differential amplifiers) might occur, the reactance feedback path of differential amplifier 70 is tuned during assembly of the radio frequency receiver. Accordingly, the present invention includes means for tuning the reactance feedback path of differential amplifier 70. Such means are represented by block 90 in FIG. 4. Tuning means 90 can be a circuit of conventional design that controls the closing of switches S1, S2 . . . Sn on a selective basis to effect the desired reactance in response to inputs to the tuning means entered either manually or automatically.

Tuning of the reactance feedback path of differential amplifier 70 places differential amplifier 70 and differential amplifier 72 in phase quadrature when the pole frequency of the reactance feedback path is at least ten times lower than the frequency of the intermediate frequency and sets the gain of differential amplifier 70 equal to the gain of differential amplifier 72 when the reactance of reactance feed back path in differential amplifier 70 is equal to the resistance of the resistance feedback path in differential amplifier 72.

The switches in series with the capacitors in the reactance feedback path of differential amplifier 70 are selectively closed to tune the reactance feedback path. Preferably, these capacitors are binary weighted to eliminate the need for a decoder.

Figure 5:
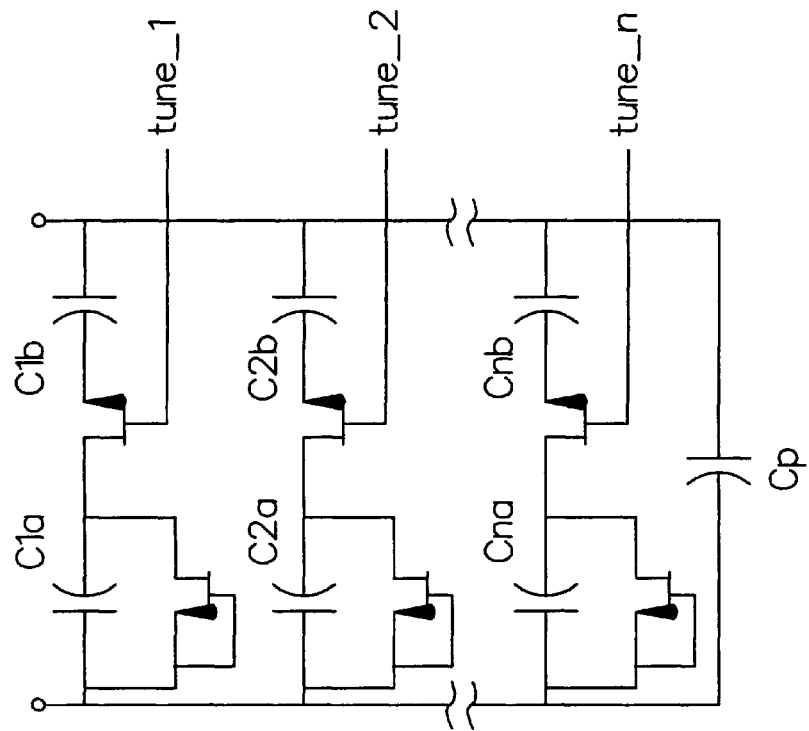
FIG. 5 is a diagram of an alternative version of a portion of the FIG. 4 intermediate frequency combiner.

Referring to FIG. 5, which depicts an alternative version of the reactance feedback path of differential amplifier 70, the capacitors of FIG. 4 have been split into two for purpose. In addition, the ideal switches S1, S2 . . . Sn of FIG. 4 have been replaced by NMOS devices where the gate voltage determines the drain to source channel resistance. A high impedance is preferred to setting a voltage reference on the NMOS switches. With this approach, an NMOS device is used in the saturation region to form a high impedance path to a voltage potential for proper switching bias. The impedance of NMOS devices is made high by using a large L/W ratio, for example six. A high impedance is desired because the purpose of this circuit is to remain as close to an ideal capacitor as possible. Alternatively, a large value resistor can be used, but the chip area associated with implementing such a large value resistor is so large that use of a resistor is very undesirable.

The number of bits used for tuning the reactance feedback path of differential amplifier 70 depends on the desired resolution. A combination of a fixed capacitor Cp and the tunable capacitors is chosen to meet the center value and tuning range requirements.

It is important to understand that the product of the resistance of the resistance feedback path of differential amplifier 72 and the capacitance of the reactance feedback path of differential amplifier 70 remain constant to maintain the 90° quadrature combining. The present invention provides a solution to the problem that is created when this resistance value and this capacitance value vary. According to the present invention, there is sufficient tunable capacitance variation to compensate for expected variations in the resistance of the resistance feedback path of differential amplifier 72. For example, if this resistance value is too high, the tunable capacitance value is reduced to compensate. Alternatively, if the resistance value is too low, the tunable capacitance value is increased to compensate.

It will become apparent, the tunable reactance feedback path of differential amplifier 70 can be composed of inductors instead of capacitors.

Although illustrated and described above with reference to certain specific embodiments, the present invention nevertheless is not intended to be limited to the details shown. Rather, various modifications may be made in the details within the scope and range of equivalents of the claims and without departing from the spirit of the invention.

What is claimed:

1. An image reject mixer comprising:
   means for supplying a radio frequency input signal;
   means for supplying:
   (a) a first local oscillator signal, and
   (b) a second local oscillator signal in phase quadrature with the first local oscillator signal;
   a first mixer responsive to the radio frequency input signal and the first local oscillator signal for developing a first intermediate frequency signal;
   a second mixer responsive to the radio frequency input signal and the second local oscillator signal for developing a second intermediate frequency signal;
   means for phase shifting the first intermediate frequency signal by 90°;
   an intermediate frequency combiner including:
   (a) a first differential amplifier responsive to one of the second intermediate frequency signal and the 90° phase shifted first intermediate frequency signal and having a tunable reactance feedback path, and
   (b) a second differential amplifier responsive to the other of the second intermediate frequency signal and the 90° phase shifted first intermediate frequency signal and having a resistance feedback path for developing an intermediate frequency output signal; and
   means for tuning said reactance feedback path of said first differential amplifier to:
   (a) place said first differential amplifier and said second differential amplifier in phase quadrature when the pole frequency of said reactance feedback path is at least ten times lower than the frequency of the intermediate frequency, and
   (b) set the gain of said first differential amplifier equal to the gain of said second differential amplifier when the reactance of said reactance feed back path in said first differential amplifier is equal to the resistance of said resistance feedback path in said second differential amplifier.

2. An image reject mixer according to claim 1 wherein said tunable reactance path is composed of a plurality of capacitors and a plurality of switches individually in series with said capacitors that are selectively closed to tune said reactance feedback path.

3. An image reject mixer according to claim 2 wherein said switches are NMOS devices.

4. A radio frequency receiver comprising:
   means for receiving a radio frequency signal;
   a low noise amplifier for amplifying said radio frequency signal;
   means for supplying:
   (a) a first local oscillator signal, and
   (b) a second local oscillator signal in phase quadrature with the first local oscillator signal;
   a first mixer responsive to the amplified radio frequency signal and the first local oscillator signal for developing a first intermediate frequency signal;
   second mixer responsive to the amplified radio frequency signal and the second local oscillator signal for developing a second intermediate frequency signal;
   means for phase shifting the first intermediate frequency signal by 90°;
   an intermediate frequency combiner including:
   (a) a first differential amplifier responsive to one of the second intermediate frequency signal and the 90° phase shifted first intermediate frequency signal and having a tunable reactance feedback path, and
   (b) a second differential amplifier responsive to the other of the second intermediate frequency signal and the 90° phase shifted first intermediate frequency signal and having a resistance feedback path for developing an intermediate frequency output signal;
   means for tuning said reactance feedback path of said first differential amplifier to:
   (a) place said first differential amplifier and said second differential amplifier in phase quadrature when the pole frequency of said reactance feedback path is at least ten times lower than the frequency of the intermediate frequency, and
   (b) set the gain of said first differential amplifier equal to the gain of said second differential amplifier when the reactance of said reactance feed back path in said first differential amplifier is equal to the resistance of said resistance feedback path in said second differential amplifier; and
   an intermediate frequency amplifier for amplifying said intermediate frequency out signal.

5. A radio frequency receiver according to claim 4 wherein said tunable reactance path is composed of a plurality of capacitors and a plurality of switches individually in series with said capacitors that are selectively closed to tune said reactance feedback path.

6. A radio frequency receiver according to claim 5 wherein said switches are NMOS devices.

7. An image reject mixer according to claim 2 further including a first low pass filter between said first mixer and said means for phase shifting and a second low pass filter between said second mixer and said intermediate frequency combiner.

8. A radio frequency receiver according to claim 5 further including a first low pass filter between said first mixer and said means for phase shifting and a second low pass filter between said second mixer and said intermediate frequency combiner.

9. An image reject mixer according to claim 3 further including a first low pass filter between said first mixer and said means for phase shifting and a second low pass filter between said second mixer and said intermediate frequency combiner.

10. A radio frequency receiver according to claim 6 further including a first low pass filter between said first mixer and said means for phase shifting and a second low pass filter between said second mixer and said intermediate frequency combiner.

* * * * *